United States Patent
Ohmi et al.

(10) Patent No.: US 8,383,194 B2
(45) Date of Patent: Feb. 26, 2013

(54) FILM FORMING APPARATUS, FILM FORMING SYSTEM, FILM FORMING METHOD, AND METHOD OF MANUFACTURING ELECTRONIC DEVICE OR ORGANIC ELECTROLUMINESCENCE ELEMENT

(75) Inventors: Tadahiro Ohmi, Miyagi (JP); Takaaki Matsuoka, Tokyo (JP); Shozo Nakayama, Aichi (JP); Hironori Ito, Aichi (JP)

(73) Assignees: Tohoku University, Miyagi (JP); Tokyo Electron Limited, Tokyo (JP)

( * ) Notice: Subject to any disclaimer, the term of this patent is extended or adjusted under 35 U.S.C. 154(b) by 1330 days.

(21) Appl. No.: 11/991,475

(22) PCT Filed: Sep. 5, 2006

(86) PCT No.: PCT/JP2006/317499
§ 371 (c)(1),
(2), (4) Date: Apr. 9, 2008

(87) PCT Pub. No.: WO2007/029671
PCT Pub. Date: Mar. 15, 2007

(65) Prior Publication Data
US 2009/0226604 A1  Sep. 10, 2009

(30) Foreign Application Priority Data
Sep. 6, 2005 (JP) .................. 2005-258043

(51) Int. Cl.
*B05D 5/06* (2006.01)
*B05C 9/06* (2006.01)

(52) U.S. Cl. ............... 427/70; 427/255.23; 118/726

(58) Field of Classification Search .................. 427/70, 427/69, 255.23; 118/726
See application file for complete search history.

(56) References Cited

U.S. PATENT DOCUMENTS 5,888,907 A    3/1999  Tomoyasu et al.
6,482,266 B1 *  11/2002  Matsumoto et al. .......... 118/715
(Continued)

FOREIGN PATENT DOCUMENTS

EP    1413644 A2    4/2004
EP    1 879 431 A1    1/2008
(Continued)

OTHER PUBLICATIONS

Japan Patent Office action on application No. 2005-258043 dated Aug. 17, 2011; pp. 1-3.

*Primary Examiner* — Joseph Del Sole
*Assistant Examiner* — Kimberly A Stewart
(74) *Attorney, Agent, or Firm* — Foley & Lardner LLP (57) ABSTRACT

To provide a film forming apparatus capable of using an expensive organic EL raw material without waste and uniformly forming an organic EL film over a long period of time and a jig therefor.

A plurality of ejection vessels are provided for a single raw material container section. A switcher is provided for carrying out switching from a piping system, which evaporates an organic EL raw material in the raw material container section and supplies it along with a carrier gas to one of the ejection vessels, to a piping system for another ejection vessel. In this manner, by supplying the organic EL raw material from the single raw material container section to the plurality of ejection vessels by switching, the use efficiency of the organic EL raw material can be improved.

27 Claims, 5 Drawing Sheets

U.S. PATENT DOCUMENTS

| | | |
|---|---|---|
| 6,698,728 B1 | 3/2004 | Ravetz et al. |
| 2002/0179013 A1 | 12/2002 | Kido et al. |
| 2004/0062862 A1 | 4/2004 | Ahn et al. |
| 2004/0134428 A1 | 7/2004 | Sasaki et al. |
| 2004/0194702 A1* | 10/2004 | Sasaki et al. ............... 118/715 |

FOREIGN PATENT DOCUMENTS

| | | |
|---|---|---|
| JP | 01-296613 | 11/1989 |
| JP | 09-291366 | 11/1997 |
| JP | 10-158843 | 6/1998 |
| JP | 2000-012534 A | 1/2000 |
| JP | 2002-069621 A | 3/2002 |
| JP | 2002-280377 | 9/2002 |
| JP | 2002-348659 A | 12/2002 |
| JP | 2003-100851 A | 4/2003 |
| JP | 2003-516304 | 5/2003 |
| JP | 2003-347047 A | 12/2003 |
| JP | 2004-079904 * | 3/2004 |
| JP | 2004-079904 A | 3/2004 |
| JP | 2005-019265 | 1/2005 |
| JP | 2006-291258 A | 10/2006 |

* cited by examiner

FILM FORMING APPARATUS, FILM FORMING SYSTEM, FILM FORMING METHOD, AND METHOD OF MANUFACTURING ELECTRONIC DEVICE OR ORGANIC ELECTROLUMINESCENCE ELEMENT

This application is the National Phase of PCT/JP2006/317499, filed Sep. 5, 2006, which claims priority to Japanese Application No. 2005-258043, filed Sep. 6, 2005, the disclosures of which are hereby incorporated by reference in their entirety.

TECHNICAL FIELD

This invention relates to a film forming apparatus for forming a layer of a predetermined material, a film forming system comprising a plurality of such film forming apparatuses, a film forming method, and a method of manufacturing an electronic device or an organic electroluminescence element using such a film forming method.

BACKGROUND ART

A method of forming a layer of a predetermined material by evaporating a raw material of the predetermined material is widely used in the manufacture of semiconductor means, flat panel display means, and other electronic means. A description will be given hereinbelow using an organic EL display device as one example of those electronic means. The organic EL display device having a sufficient brightness and a lifetime of several tens of thousands of hours or more uses an organic EL element being a self-light-emitting element and, thus, since peripheral components such as a backlight are small in number, it can be formed thin, and therefore, it is ideal as a flat panel display device.

The organic EL element constituting such an organic EL display device is required in terms of characteristics as a display device such that, while being a large screen, the element lifetime is long, there is no variation in luminous brightness in the screen and element lifetime, and there is no defect such as, typically, a dark spot. In order to satisfy such requirements, the organic EL film forming technique is quite important.

For example, as a film forming apparatus for uniformly forming an organic EL film on a large substrate of about 20 inches, use is made of an apparatus described in Patent Document 1 (Japanese Unexamined Patent Application Publication (JP-A) No. 2004-79904) or the like. The film forming apparatus of Patent Document 1 aims to achieve uniformity in film thickness on a large substrate by optimally arranging, in a tree fashion, a piping structure inside an injector disposed in the apparatus so as to uniformly disperse a raw material gas on the substrate along with a carrier gas.

Recently, an increase in size of 20 inches or more has also been required for this type of organic EL device. However, in order to respond to such a requirement, it is necessary to overcome various drawbacks peculiar to the organic EL device that is poor in light emitting efficiency and short in lifetime. Herein, since various organic EL films, including a light emitting layer, forming the organic EL device are as extremely thin as several tens of nm as compared with films formed in other display devices, a technique of forming a film on a molecular basis is required and, further, it is also quite important to perform the film formation on the molecular basis with high accuracy.

As a film forming apparatus also applicable to the increase in size of 20 inches or more, the present inventors have proposed, in Japanese Patent Application No. 2005-110760 (Prior Application 1), a film forming apparatus for uniformly and quickly forming a film of each of various organic EL raw materials forming an organic EL device.

The proposed film forming apparatus comprises two raw material containers for vaporizing/evaporating the same organic EL raw material, an ejection vessel for ejecting the organic EL raw material onto a substrate, and a piping system (i.e. flow paths) connecting the raw material containers and the ejection vessel to each other. In this case, when supplying the organic EL raw material to the ejection vessel from one of the raw material containers, the piping system including valves and orifices is switched in mode before the start of the film formation, at the time of the film formation, and at the time of stopping the film formation and the temperature of the piping system is controlled. In this structure, during the time other than the film formation, a gas remaining in the piping system is quickly exhausted and a gas is circulated to the other raw material container.

In the film forming apparatus shown in Prior Application 1, it is possible to prevent contamination due to the gas remaining in the piping system and further to quickly perform the state transition before the start of the film formation, at the time of the film formation, and at the time of stopping the film formation. Since the contamination due to the organic EL material remaining in the piping system can be prevented, the film forming apparatus according to Prior Application 1 can significantly improve the brightness and lifetime of an organic EL device.

However, it has been found out that when the structure shown in Prior Application 1 is employed, it is necessary to further improve the use efficiency of the organic EL material forming a light emitting layer or the like of an organic EL device and, for a further increase in size of an organic EL device, it is necessary to further improve the brightness of an organic EL element and to achieve an increase in lifetime of the organic EL element.

Further, in the film forming apparatus shown in Prior Application 1, the evaporated organic EL material is blown into the ejection vessel from one of the raw material containers during the film formation, but is exhausted to the exterior from the one of the raw material containers during the time other than the film formation. In this manner, the organic EL material is effectively used only during the film formation but is not effectively used during the time other than the film formation and, therefore, there has also been found out a drawback that the use efficiency of the using organic EL material is low.

An explanation will be given here of the characteristics and structure of an organic EL device aimed at by this invention. At first, the organic EL device aimed at by this invention is an organic EL device having a long lifetime of 10000 hours or more and a light emitting efficiency of 100 lm/V or more. To briefly explain the structure of the organic EL device according to this invention, it comprises, on a glass substrate, an anode in the form of a transparent conductive film and a cathode made of Li/Ag or the like and provided so as to face the anode, and a plurality of layers, for example, seven or five organic layers, disposed between the anode and the cathode. Herein, the organic layers are, for example, in the form of an electron injection layer, an electron transport layer, a light emitting layer, a hole transport layer, and a hole injection layer from the cathode side. The light emitting layer comprises, for example, a red light emitting layer, a green light emitting layer, and a blue light emitting layer and, by forming the red light emitting layer, the green light emitting layer, and the blue light emitting layer into a laminated structure in this manner, it is possible to emit white light with high efficiency.

Among the above organic layers, particularly the red light emitting layer, the green light emitting layer, and the blue light emitting layer forming the light emitting layer each have a thickness of about 20 nm and even the electron transport layer and the hole transport layer each have a thickness of about 50 nm. In this manner, the organic layers of the organic EL device are extremely thin as compared with the thicknesses of various films of other semiconductor devices, but, for future, an attempt is made to further reduce the thicknesses of these organic layers. In order to deposit/form an extremely thin organic layer with high accuracy, there is required an ultraprecise technology for forming a raw material of an organic layer on a molecular basis. Consequently, this means that contamination even on a molecular basis is not allowed for formation of an organic layer.

Patent Document 1: Japanese Unexamined Patent Application Publication (JP-A) No. 2004-79904

DISCLOSURE OF THE INVENTION

Problem to be Solved by the Invention

It is an object of this invention to provide a film forming apparatus, a film forming system, a film forming method, and a method of manufacturing an electronic device or an organic electroluminescence element, which can efficiently use a raw material.

It is another object of this invention to provide a film forming system, a film forming method, and a method of manufacturing an electronic device or an organic electroluminescence element, which are suitable for quickly laminating films of predetermined materials in order.

Means for Solving the Subject

According to a first aspect of the invention, there is provided a film forming apparatus that evaporates a raw material by evaporation means, transports the evaporated raw material using a carrier gas, and ejects the carrier gas containing the evaporated raw material onto a substrate from gas ejection means, thereby depositing a film of a predetermined material, the film forming apparatus characterized in that a plurality of the gas ejection means are provided for one the evaporation means.

It is preferable that the film forming apparatus comprises gas flow paths provided from the one evaporation means to the plurality of gas ejection means, respectively, and switching means for supplying the carrier gas containing the evaporated raw material to the gas ejection means selected from the plurality of gas ejection means.

It is also preferable that the film forming apparatus further comprises carrier gas supply means for supplying a gas of the same kind as the carrier gas to the gas ejection means not through the evaporation means.

It is also preferable in one of the film forming apparatuses that each of the plurality of gas ejection means comprises an ejection vessel, a gas dispersion plate provided in the ejection vessel for dispersing the carrier gas containing the evaporated raw material, and a filter or shower plate provided between the gas dispersion plate and the substrate, the ejection vessel is provided with a supply port, and the carrier gas is supplied into the ejection vessel through the supply port.

It is also preferable in the film forming apparatus that the ejection vessel has a plurality of the supply ports, a gas pressure adjusting portion is further provided between the evaporation means and the ejection vessel, and lengths of piping between the gas pressure adjusting portion and the plurality of supply ports of the ejection vessel are substantially equal to each other.

It is preferable in the film forming apparatus that a plurality of the gas dispersion plates are provided, the plurality of gas dispersion plates and the plurality of supply ports are arranged in one row in the same direction, and the filter or shower plate has a shape extending in the direction. It is preferable that the piping between the supply ports and the gas pressure adjusting portion is branched into $2^n$ (n is a natural number) paths.

It is also preferable in any one of the film forming apparatuses that different substrates are supplied to the plurality of gas ejection means at different timings, respectively.

It is also preferable in any one of the film forming apparatuses that an opening width of the gas ejection means, a moving speed of the substrate, a flow speed of the carrier gas, and a supply amount of the carrier gas are determined so as to obtain a predetermined film thickness.

It is preferable that the evaporation means comprises a raw material container section filled with the raw material, piping for introducing the carrier gas into the raw material container section, and a heater for heating the raw material.

According to a second aspect of the invention, there is provided a film forming system comprising a plurality of the film forming apparatuses, the film forming system characterized in that the film forming system is for stacking a plurality of films of predetermined materials on the substrate, the plurality of film forming apparatuses correspond to the different materials, respectively, and the gas ejection means corresponding to the respective materials, one for each material, are aligned along a moving direction of the substrate in the order of stacking of the films.

It is preferable in the film forming system that the gas ejection means are aligned so that the extending directions of the filters or shower plates are parallel to each other, a partition is provided between the aligned gas ejection means, the substrate moves at a predetermined distance maintained from the partition, the distance between the substrate and the partition is smaller than that between the substrate and the gas ejection means, and a space is provided between the gas ejection means and the partition.

It is preferable that the gas of the same kind as the carrier gas is supplied through the gas supply means to the gas ejection means not supplied with the carrier gas containing the evaporated raw material. It is preferable that a flow rate of the gas of the same kind as the carrier gas is substantially equal to that of the carrier gas containing the evaporated raw material.

It is preferable in any one of the film forming systems that the materials are materials for forming an organic electroluminescence element.

According to a third aspect of the invention, there is provided a film forming apparatus for forming a film on a substrate using a fluid in the form of a gas or a liquid, the film forming apparatus characterized in that the fluid is supplied onto the substrate through a porous ceramic so as to be brought into contact with the substrate uniformly at a predetermined angle.

According to a fourth aspect of the invention, there is provided a film forming apparatus that evaporates a raw material by evaporation means, transports the evaporated raw material using a carrier gas, and ejects the carrier gas containing the evaporated raw material onto a substrate from gas ejection means, thereby depositing a film of a predetermined material, wherein the gas ejection means comprises a gas ejection vessel, a plurality of supply ports provided at the ejection vessel, gas dispersion plates provided corresponding to the plurality of supply ports, respectively, for dispersing the carrier gas containing the evaporated raw material supplied into the ejection vessel through the supply ports, and a gas ejection plate provided in the ejection vessel on a side of the substrate and having many small holes.

It is preferable in the film forming apparatus that the gas ejection plate comprises a filter or shower plate. It is also preferable that piping for supplying the carrier gas containing the evaporated raw material to the ejection vessel from the evaporation means is branched into a plurality of paths after passing through a gas pressure adjusting portion so as to be connected to the plurality of gas supply ports, and lengths of piping between the gas pressure adjusting portion and the plurality of supply ports are substantially equal to each other.

It is preferable that piping between the plurality of supply ports and the gas pressure adjusting portion is branched into $2^n$ (n is a natural number) paths. It is preferable that the plurality of gas dispersion plates and the plurality of supply ports are arranged in one row in the same direction, and the gas ejection plate has a shape extending in the direction.

It is preferable that the film forming system comprises a plurality of the film forming apparatuses, the film forming system characterized in the gas ejection means are aligned so that the extending directions of the gas ejection plates are parallel to each other, a partition is provided between the aligned gas ejection means, the substrate moves at a predetermined distance maintained from the partition, the distance between the substrate and the partition is smaller than that between the substrate and the gas ejection means, and a space is provided between the gas ejection means and the partition.

According to a fifth aspect of the invention, there is provided a film forming method that evaporates a raw material by evaporation means, transports the evaporated raw material using a carrier gas, and ejects the carrier gas containing the evaporated raw material onto a substrate from gas ejection means, thereby forming a film of a predetermined material, the film forming method characterized in that a plurality of the gas ejection means are connected to one the evaporation means and the carrier gas containing the evaporated raw material is supplied to the gas ejection means selected from the plurality of gas ejection means.

It is preferable in the film forming method that each of the plurality of gas ejection means comprises an ejection vessel, the ejection vessel is provided with a plurality of supply ports and gas dispersion plates corresponding to the plurality of supply ports, respectively, and the carrier gas ejected into the ejection vessel through the supply ports is dispersed by the gas dispersion plates and then ejected onto the substrate through a filter or shower plate. It is also preferable that a gas of the same kind as the carrier gas can be supplied to the gas ejection means not through the evaporation means, and the carrier gas containing the evaporated raw material and the gas of the same kind as the carrier gas are supplied to the gas ejection means exclusively to each other. It is also preferable that a flow rate of the gas of the same kind as the carrier gas is substantially equal to that of the carrier gas containing the evaporated raw material.

It is preferable in any one of the film forming methods that different substrates are supplied to the plurality of gas ejection means at different timings, respectively. It is preferable that a moving speed of the substrate and a flow speed and a supply amount of the carrier gas containing the evaporated raw material are determined so as to obtain a predetermined film thickness.

According to another aspect of the invention, there is provided a manufacturing method of a laminate in which a plurality of films of predetermined materials are stacked on a substrate, the manufacturing method characterized in that one evaporation means and a plurality of gas ejection means are provided for each of the predetermined materials of the films selected from the plurality of films, and the gas ejection means corresponding to the respective materials, one for each material, are aligned in the order of stacking of the films, thereby forming the selected films in the order of stacking of the films, respectively, using any one of the methods. It is preferable that the manufacturing method is characterized by moving the substrate over the aligned gas ejection means and continuously supplying the carrier gases containing the evaporated raw materials in the order of stacking of the films along a moving direction of the substrate. It is also preferable that the manufacturing method is characterized by arranging the plurality of gas supply ports and the plurality of gas dispersion plates in one row in the same direction, forming the filter or shower plate to have a shape extending in the direction, arranging the plurality of ejection vessels through partitions therebetween so that the extending directions of the filters or shower plates are parallel to each other, and, while moving the substrate at a predetermined distance from the partitions and in a direction crossing the direction, ejecting in sequence the carrier gases containing the different evaporated raw materials to the substrate from the plurality of ejection vessels, respectively, at a distance greater than the predetermined distance, and exhausting the ejected carrier gases containing the evaporated raw materials through spaces between the ejection vessels and the partitions.

According to this invention, there is provided a film forming method for forming a film on a substrate using a fluid in the form of a gas or a liquid, the film forming method characterized by supplying the fluid onto the substrate through a porous ceramic so as to be brought into contact with the substrate uniformly at a predetermined angle.

According to this invention, there is also provided a film forming method that evaporates a raw material by evaporation means, transports the evaporated raw material using a carrier gas, and ejects the carrier gas containing the evaporated raw material onto a substrate from gas ejection means, thereby forming a film of a predetermined material, the film forming method characterized in that the gas ejection means comprises a gas ejection vessel and the carrier gas containing the evaporated raw material is introduced into the ejection vessel through a plurality of supply ports, then dispersed by gas dispersion plates, and then ejected toward the substrate through a filter or shower plate including many small holes and disposed in the ejection vessel on a side of the substrate.

It is preferable in the film forming method that piping connecting the evaporation means and the ejection vessel to each other is branched into a plurality of pipings after passing through a gas pressure adjusting portion so as to be connected to the plurality of gas supply ports, lengths of the plurality of branched pipings between the gas pressure adjusting portion and the supply ports are set substantially equal to each other, and the carrier gas containing the evaporated raw material is supplied to the ejection vessel substantially uniformly in terms of time and amount with respect to all of the plurality of branched pipings. It is preferable that the film forming method is characterized by supplying the carrier gas containing the evaporated raw material into the ejection vessel through the $2^n$ supply ports. It is also preferable that the film forming method is characterized by arranging the plurality of gas supply ports and the plurality of gas dispersion plates in one row in the same direction, forming the filter or shower plate to have a shape extending in the direction, arranging a plurality of the ejection vessels through partitions therebetween so that the extending directions of the filters or shower plates are parallel to each other, and, while moving the substrate at a predetermined distance from the partitions and in a direction crossing the direction, ejecting in sequence the carrier gases containing different evaporated raw materials to the substrate from the plurality of ejection vessels, respectively, at a distance greater than the predetermined distance, and exhausting the ejected carrier gases containing the evaporated raw materials through spaces between the ejection vessels and the partitions.

According to another aspect of this invention, there is provided an electronic device manufacturing method characterized by comprising a step of performing film formation by any one of the film forming methods.

According to still another aspect of this invention, there is provided an organic electroluminescence element manufacturing method characterized by forming an organic electric field light emitting layer by any one of the film forming methods.

There is also provided a manufacturing method according to any one of the manufacturing methods, wherein the manufacturing method is characterized in that the laminate is an organic electroluminescence element.

Although organic EL film forming apparatuses will be described hereinbelow, it is needless to say that this invention is not limited thereto at all and can be applied to various film forming apparatuses.

Effect of the Invention

In this invention, there are obtained a film forming apparatus, a film forming system, a film forming method, and a method of manufacturing an electronic device or an organic electroluminescence element, which can largely improve the use efficiency of a raw material. Further, in this invention, there is obtained a film forming system suitable for quickly laminating films of predetermined materials in order.

DESCRIPTION OF SYMBOLS 20 organic EL source section
201 raw material container section
26, 27, 28 film forming section
29 switcher
31 carrier gas piping system
331, 332, 333 piping system
203 evaporating portion
202 partition
261 ejection vessel
262 stage
263 gas dispersion plate
264 filter
30 glass substrate

BEST MODE FOR CARRYING OUT THE INVENTION

Figure 1:
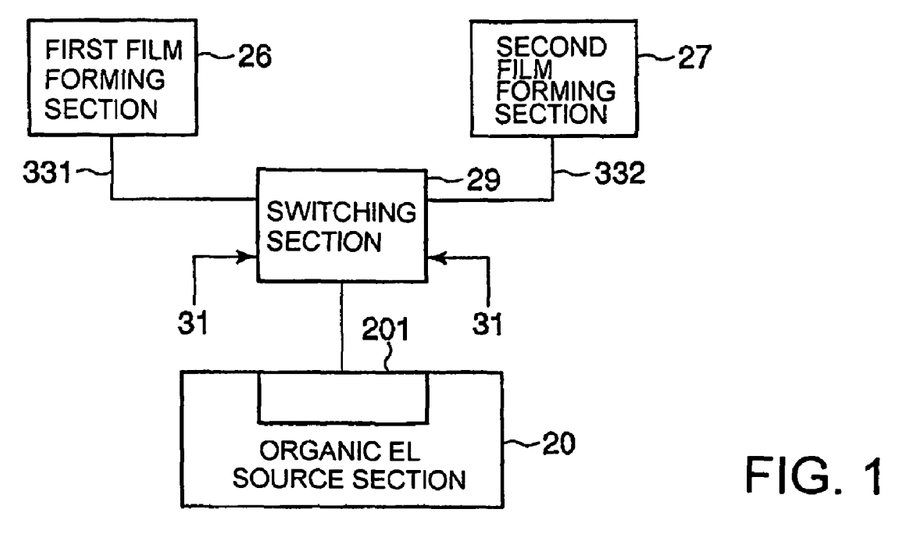
FIG. 1 is a schematic structural diagram showing a film forming apparatus according to a first embodiment of this invention.

Referring to FIG. 1, a film forming apparatus according to a first embodiment of this invention is schematically illustrated. The illustrated film forming apparatus comprises an organic EL source section 20 having a plurality of organic EL sources, first and second film forming sections 26 and 27, and a switching section 29 (switching means) for supplying an evaporated organic EL material from the organic EL source section 20 selectively to the first and second film forming sections 26 and 27. The switching section 29 comprises piping, orifices, mass controllers (flow control systems), valves, and so on. In this connection, the switching section 29 is controlled by a controller (not shown) that controls the valves, the orifices, the flow control systems, and the valves.

Specifically, the illustrated organic EL source section 20 has container sections (hereinafter referred to as raw material container sections) containing organic EL raw materials corresponding to the number of organic EL films to be deposited. For example, in the case of three kinds of organic EL raw materials to be deposited on a glass substrate, the organic EL source section 20 includes three raw material container sections containing the three kinds of organic EL raw materials, respectively. In the case of depositing more kinds of organic EL raw materials, there are provided raw material container sections, containing the organic EL raw materials, corresponding to the number of those raw materials. For example, in the case where organic EL films to be deposited are six layers including an electron transport layer, a red light emitting layer, a green light emitting layer, a blue light emitting layer, an electron blocking layer, and a hole transport layer, six raw material container sections containing raw materials for forming the respective layers are provided in the organic EL source section 20.

Further, in each raw material container section 201 of the organic EL source section 20, there are provided not only an evaporating jig (i.e. an evaporating dish) containing the organic EL raw material for evaporation thereof, but also a heater for heating the organic EL material in the evaporating jig. A carrier gas such as argon, xenon, or krypton is introduced into the evaporating jig of each raw material container section 201 through valves, a flow control system, and a piping system.

Herein, in each raw material container section 201, the carrier gas is introduced and heating is carried out by the heater and, as a result of this, the organic EL material in the evaporating jig is evaporated. Therefore, each raw material container section 201 has a function as evaporation means for evaporating the organic EL material. In the figure, only the single raw material container section 201 is shown in the organic EL source section 20 for simplification of description, but the organic EL source section 20 is further provided with the raw material container sections corresponding to the other organic EL raw materials. In this manner, each raw material container section operates as evaporation means for evaporating the organic EL raw material.

On the other hand, the switching section 29 is provided corresponding to the illustrated raw material container section 201 and, although the same switching sections are provided for the other raw material container sections, respectively, illustration thereof is omitted here for simplification. Carrier gas piping systems 31 (piping, valves, flow control systems, orifices, etc) each for supplying a gas of the same kind as the carrier gas such as argon, xenon, or krypton to the switcher 29 are connected to the switching section 29 and, herein, are provided in one-to-one correspondence with the first and second film forming sections 26 and 27. This carrier gas piping system 31 is carrier gas supply means for supplying the carrier gas to gas ejection means not through the evaporation means.

The illustrated switching section 29 comprises a piping system including therein piping, valves, orifices, flow control systems, and so on and supplies the carrier gas and the evaporated organic EL raw material selectively to the first and second film forming sections 26 and 27.

The first and second film forming sections 26 and 27 have the same structure as each other and, as will be described later, are respectively connected to the switcher 29 through piping systems 331 and 332 having portions with the same piping path length as each other. A description will be given assuming that the illustrated first and second film forming sections 26 and 27 eject and deposit an organic EL raw material evaporated in the illustrated raw material container section 201. However, when depositing a plurality of organic EL raw materials in the first and second film forming sections 26 and 27, respectively, it is necessary to provide a plurality of switchers between a plurality of raw material container sections and the first and second film forming sections 26 and 27 and to provide piping systems (gas flow paths) for connection between the plurality of raw material container sections and the first and second film forming sections 26 and 27 through those switchers.

Each of the first and second film forming sections 26 and 27 comprises an ejection vessel configured to uniformly eject a carrier gas containing the evaporated organic EL raw material onto a glass substrate and a conveyor for conveying the glass substrate on a stage maintained at a constant temperature and operates to eject the carrier gas containing the evaporated organic EL raw material onto the glass substrate from the ejection vessel to thereby deposit an organic EL film thereon. Therefore, the ejection vessel can be called gas ejection means. As is also clear from this, the illustrated film forming apparatus has a plurality of gas ejection means for one evaporation means.

The ejection vessel comprises supply ports arranged such that the organic EL material from the piping system 331, 332 is uniformly dispersed, and a filter for guiding the organic EL material to the glass substrate or the like. The filter may be replaced with a shower plate in the form of a ceramic or metal plate formed with fine holes.

Hereinbelow, the operation of the film forming apparatus shown in FIG. 1 will be described. At first, an organic EL raw material (organic EL molecules) evaporated by heat and a carrier gas is produced from the raw material container section 201. In this state, when the first film forming section 26 is selected by the switching section 29, the organic EL material from the raw material container section 201 is supplied to the first film forming section 26 through the piping system of the switching section 29 and through the piping system 331 in the evaporated state along with the carrier gas. While the organic EL raw material is supplied to the first film forming section 26, the piping system 332 connected to the second film forming section 27 is closed. While film formation is performed in the first film forming section 26, a glass substrate is supplied to an inlet of the second film forming section 27 so that the second film forming section 27 is in a film formation standby state.

When deposition of the organic EL raw material is finished in the first film forming section 26, the organic EL raw material from the raw material container section 201 is supplied to the second film forming section 27 through the piping system 332 due to switching of the piping system by the switcher 29. While film formation is performed in the second film forming section 27, the glass substrate finished with the film formation in the first film forming section 26 is guided by the conveyor to another ejection vessel provided in the first film forming section 26 for forming a film of another organic EL raw material, so that the film formation is carried out using this other organic EL raw material. In other words, different substrates are supplied at different timings to a plurality of gas ejection means corresponding to one evaporation means.

Subsequently, in the same manner as described above, the first and second film forming sections 26 and 27 are controlled to be switched therebetween at the timings determined by the switcher 29 and organic EL raw materials to be deposited are switched in order, so that organic EL films necessary for an organic EL device are deposited on each of the glass substrates moving in parallel.

Herein, the piping system 332 between the switcher 29 and the second film forming section 27 has a length equal to that of the piping system 331 between the switcher 29 and the first film forming section 26 and a piping tree is formed so that film formation is performed under the same conditions. Further, the piping systems 331 and 332 are controlled so that the organic EL raw material is supplied to the first and second film forming sections 26 and 27 at the same flow rate. As a result of this, in the first and second film forming sections 26 and 27, film formation of the same organic EL raw material is selectively carried out under the same conditions.

Therefore, according to this structure, when film formation is finished in one of the film forming sections 26 and 27, film formation can also be performed in the other of the film forming sections 26 and 27 under entirely the same conditions. Further, while a glass substrate finished with film formation is moving in one of the film forming sections 26 and 27, switching is made to the other of the film forming sections 26 and 27 so that the organic EL raw material is supplied to the film forming section after the switching under the same conditions as the one of the film forming sections. Accordingly, the film forming apparatus shown in FIG. 1 can form in order organic EL material films on a plurality of glass substrates in a simultaneous parallel fashion and utilize the organic EL raw material from the raw material container section 201 without waste, thus making it possible to largely improve the use efficiency of the organic EL raw material.

Figure 2:
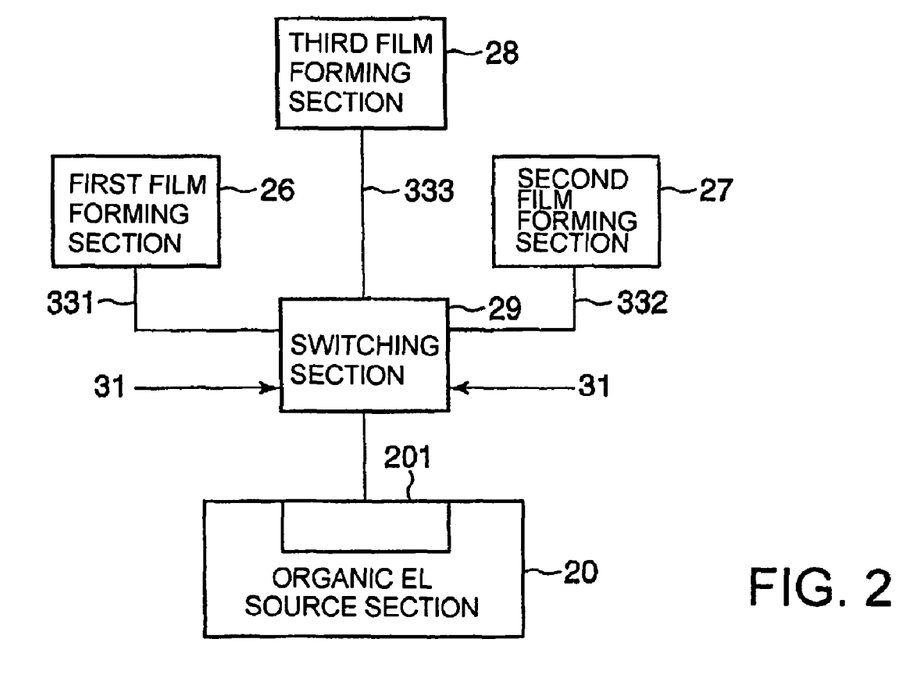
FIG. 2 is a schematic structural diagram showing a film forming apparatus according to a second embodiment of this invention.

Referring to FIG. 2, there is shown a conceptual diagram of a film forming apparatus according to a second embodiment of this invention. The illustrated example differs from the film forming apparatus of FIG. 1 in that an organic EL raw material from an organic EL source section 20 is individually supplied to three film forming sections, i.e. first to third film forming sections 26 to 28, through a switcher 29, while it is supplied only to the two film forming sections 26 and 27 in the film forming apparatus of FIG. 1. In the illustrated example, the third film forming section is connected to the switcher 29 through a piping system 333 and the piping system 333 is controlled in the same manner as the other piping systems 331 and 332.

At any rate, in the film forming apparatus shown in FIG. 2, an evaporated organic EL raw material from each raw material container section 201 is selectively supplied to the first to third film forming sections 26 to 28 through a switcher 29.

Figure 3:
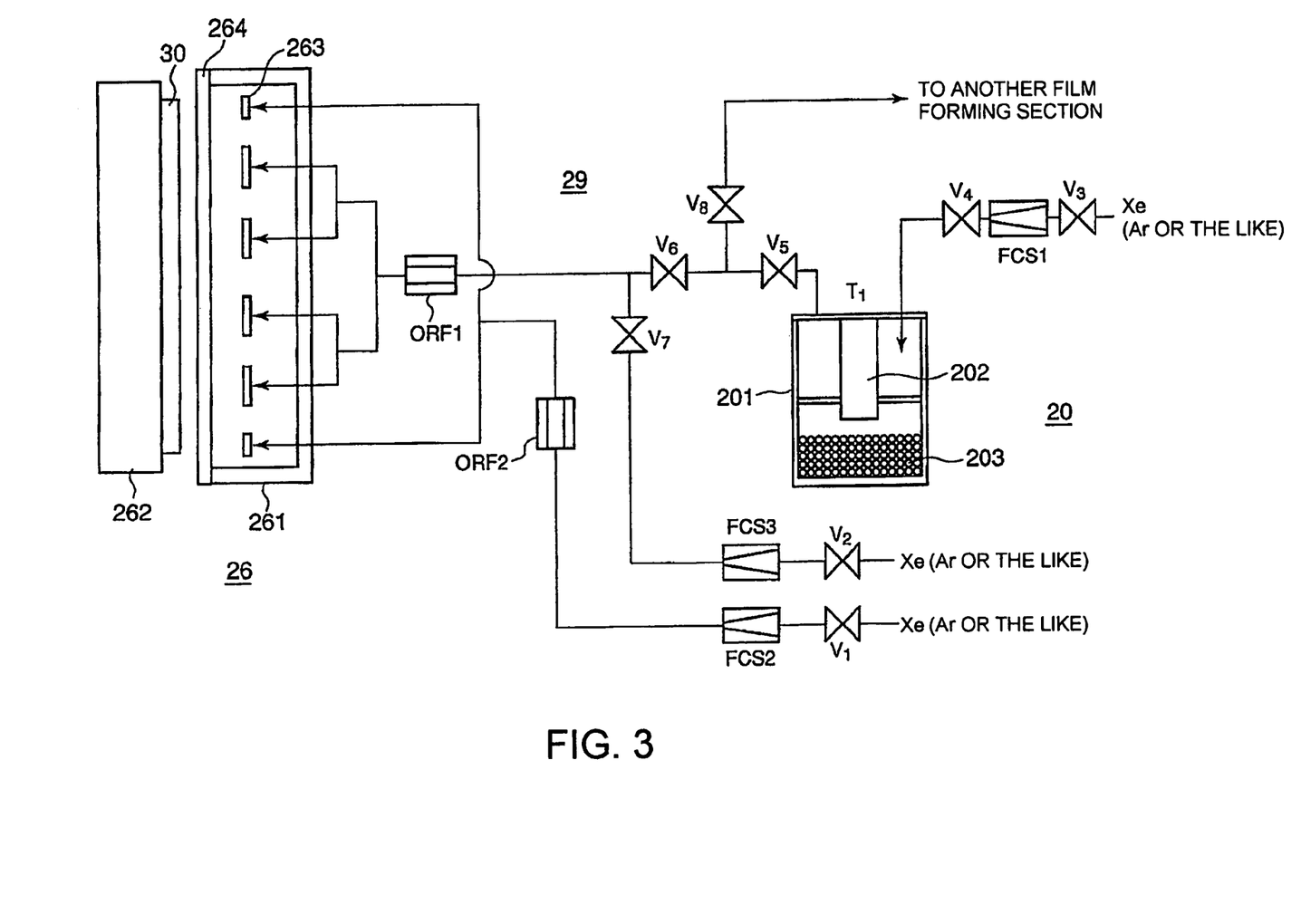
FIG. 3 is a diagram for more specifically explaining a piping system, a switcher, and a film forming section of the film forming apparatus shown in FIG. 1 or 2.

Referring to FIG. 3, there is shown a portion of the film forming apparatus shown in FIG. 1 or 2, wherein the connection relationship among the organic EL source section 20, the switcher 29, and the single film forming section 26 is shown along with a partial structure of the inside of the film forming section 26. The film forming section 26 shown in FIG. 3 comprises an ejection vessel 261 for ejecting a carrier gas containing an organic EL raw material (molecules) in the film forming section 26 and a stage 262 supporting a glass substrate 30. In the state where the glass substrate 30 is mounted thereon, the stage 262 is movable, for example, in a direction perpendicular to the sheet surface of FIG. 3. Further, inside the ejection vessel 261, gas dispersion plates 263 are provided in the number of six in this example and a filter 264 made of metal or ceramic is disposed at a position facing the glass substrate 30. Supply ports are provided corresponding to the gas dispersion plates and both are arranged in a row in the same direction (vertical direction on the sheet surface of FIG. 3). The filter (or a shower plate) has a shape extending in the arranging direction of the supply ports and the gas dispersion plates. The inside of the illustrated film forming section 26 is maintained at a pressure of about 5 to 30 mTorr and the stage 262 is maintained at room temperature.

Herein, the filter 264 is preferably made of a porous ceramic. Generally, when the filter 264 made of the porous ceramic is used, a fluid in the form of a gas or a liquid can be uniformly supplied onto a large-area substrate at a predetermined angle.

On the other hand, the illustrated organic EL source 20 is featured by a single raw material container section 201, wherein the illustrated raw material container section 201 is connected to upstream piping and downstream piping. The upstream piping is piping for introducing a carrier gas into the raw material container section 201 and, as illustrated, includes a flow control system (FCS1) and valves V3 and V4 provided before and after the flow control system FCS1. The downstream piping forms part of the switcher 29.

The raw material container section 201 is divided into an upstream region and a downstream region by a vertically extending partition 202 and an evaporating portion 203 filled with an organic EL raw material is provided under the partition 202. Further, as described before, the raw material container section 201 is provided with a heater (not shown).

In this structure, the carrier gas introduced through the upstream piping is led into the evaporating portion 203 through the upstream region of the raw material container section 201, so that the organic EL raw material (molecules) evaporated in the evaporating portion 203 due to heating by the heater is, along with the carrier gas, led out into the downstream piping through the downstream region of the raw material container section 201.

Like in FIGS. 1 and 2, the switcher 29 is connected to the raw material container section 201. The switcher 29 shown in FIG. 3 comprises a piping system establishing connection between the plurality of film forming sections 26, 27, etc. and the organic EL source section 20 (i.e. the raw material container section 201) and a piping system for supplying a carrier gas to the film forming section 26.

Specifically, a piping system of the switcher 29 establishing connection between the raw material container section 201 and the ejection vessel 261 of the film forming section 26 comprises a first piping system including valves V5 and V6 and an orifice ORF1 and extending to the supply ports corresponding to the four gas dispersion plates 263 provided in the ejection vessel 261 and a second piping system directly leading an externally provided carrier gas source (not shown) of xenon, argon, or the like to the two gas dispersion plates 263 of the ejection vessel 261. The second piping system reaches the supply ports corresponding to the gas dispersion plates 263 of the ejection vessel 261 through a valve V1, a flow control system FCS2, and an orifice ORF2. Further, a third piping system for introducing a gas of the same kind as the carrier gas from the exterior is connected to the first piping system between the orifice ORF1 and the valve V6. This third piping system includes a valve V2, a flow control system FCS3, and a valve V7. Further, a fourth piping system for supplying the evaporated organic EL raw material to another film forming section (e.g. 27 in FIG. 1) is connected to the first piping system between the valves V5 and V6. This fourth piping system includes a valve V8. What is shown as "orifice" in the figure is a gas pressure adjusting portion having an orifice and a valve for adjusting/controlling a gas pressure. Therefore, the gas pressure adjusting portion is provided between the evaporation means and the ejection vessel, and the gas pressure adjusting portion and the supply ports of the ejection vessel are connected to each other by the piping.

Herein, if, in the first piping system for supplying the carrier gas containing the organic EL raw material (molecules) to the ejection vessel 261, the lengths of the piping between the orifice ORF1 and the supply ports of the ejection vessel 261 are all set equal to each other, it is possible to supply the organic EL raw material (molecular gas) so as to reach the glass substrate 30 uniformly and simultaneously. In this connection, in the illustrated example, the number of the organic EL molecular gas supply ports in the ejection vessel 261 is set to $2^n$, and these supply ports and the orifice ORF1 are connected to each other by the piping branched into $2^n$ paths (n is a natural number). Further, by providing the same piping between the orifice ORF1 and the supply ports of the ejection vessel 261 in each of the plurality of film forming sections, it is possible to uniformly form films of the same organic EL material under the same conditions in the plurality of film forming sections.

Only the carrier gas is supplied to the gas dispersion plates 263 provided at both upper and lower ends in FIG. 3.

Further, the temperature of the first piping system from the raw material container section 201 to the ejection vessel 261 is set higher than the temperature of the raw material container section 201 supplying the organic EL raw material, so as to prevent deposition/adsorption of the organic EL raw material (molecules) on the walls of pipes forming the piping system.

Herein, referring to FIGS. 1 and 3, the operation of the film forming apparatus will be described. At first, the operation of the illustrated film forming apparatus can be classified into operations before the start of film formation, during the film formation, and at the time of stopping the film formation for each of the film forming sections 26 and 27. Herein, a description will be given assuming that the operations before the start of the film formation, during the film formation, and at the time of stopping the film formation are a mode 1, a mode 2, and a mode 3, respectively.

In the mode 1 before the start of the film formation for the film forming section 26, the valves V1, V2, V3, V4, and V7 are in the open state, the valve V6 is in the closed state, and the valves V5 and V8 are in the open state. Accordingly, in the mode 1, the carrier gas is supplied into the ejection vessel 261 through the valve V1, the flow control system FCS2, and the orifice ORF2, while the carrier gas flows into the ejection vessel 261 through the valve V2, the flow control system FCS3, the valve V7, and the orifice ORF1. In this state, the pressure in the ejection vessel 261 and the pressure on the glass substrate 30 are controlled at predetermined pressures. In this case, for example, the pressure in the ejection vessel 261 is controlled at 10Torr and the pressure on the glass substrate is controlled at 1 mTorr.

Further, in the state of the mode 1, since the valves V3 and V4 are in the open state, the carrier gas to be introduced into the raw material container section 201 that supplies the organic EL molecules is introduced into the raw material container section 201 through the path of the valve V3, the flow control system FCS1, and the valve V4 and, since the valve V6 is in the closed state, the organic EL raw material is not fed to the film forming section 26 but is supplied to the other film forming section (e.g. 27) through the valves V5 and V8 in the open state. Naturally, in a mode before the start of the film formation for the entire film forming apparatus, the valves V5 and V8 are also set to the closed state and, therefore, the organic EL raw material is not fed to either of the film forming sections 26 and 27 from the raw material container section 201 and only the gas of the same kind as the carrier gas is fed thereto through the piping systems provided for both film forming sections, respectively.

In FIG. 3, when the film formation in the first film forming section 26 is started, the state for this film forming section shifts from the mode 1 to the mode 2. In the mode 2 during the film formation, the valves V2, V7, and V8 are set to the closed state, while, the valves V1, V3, V4, V5, and V6 are set to the open state. As a result of this, the carrier gas is fed to the upper and lower supply ports of the ejection vessel 261 through V1, the flow control system FCS2, and the orifice ORF2 and, further, the organic EL molecular gas evaporated in the raw material container section 201 is supplied to the four supply ports of the ejection vessel 261 through the path of V5, V6, and the orifice ORF1 by the carrier gas introduced through the path of the valve V3, the flow control system FCS1, and the valve V4.

In this mode 2, the gas (flow rate f1) of the same kind as the carrier gas that was supplied through the valve V2, the flow control system FCS3, the valve V7, and the orifice ORF1 is stopped. On the other hand, in order to keep constant the pressure in the ejection vessel 261 and the pressure in a chamber, it is preferable that the carrier gas flow rate from the raw material container section 201 serving to supply the organic EL molecules to the ejection vessel 261 be, in principle, set equal to the foregoing flow rate f1. That is, the transport gas flow rate in the path of the valves V5 and V6 and the orifice ORF1 is preferably equal to the flow rate f1 of the gas of the same kind as the carrier gas that was fed in the path of the valve V2, the flow control system FCS3, the valve V7, and the orifice ORF1 in the mode 1.

Next, referring to FIG. 3, the mode 3 at the time of stopping the film formation for the first film forming section 26 will be described. When shifting from the state of the mode 2 to the state of the mode 3, the valve V6 is set to the closed state and the valves V5 and V8 are set to the open state and, simultaneously, the valves V2 and V7 are set to the open state. That is, in the mode 3, the valves V1, V2, V3, V4, V5, V7, and V8 are set to the open state, while, the valve V6 is set to the closed state, so that the organic EL raw material from the raw material container section 201 is supplied to the other film forming section (e.g. 27).

In this manner, in the mode 3, since the valves V5 and V8 are set to the open state, the carrier gas containing the organic EL molecules flows from the raw material container section 201 side to the other film forming section at the flow rate f1 in the mode 2. On the other hand, since the valves V2 and V7 are set to the open state, the gas of the same kind as the carrier gas flows into the ejection vessel 261 of the first film forming section 26 through the orifice ORF1 at the flow rate f1 equal to that in the mode 1. By this gas of the same kind as the carrier gas, the organic EL molecules in the piping from the valve V6, which was in the open state in the mode 2, to the ejection vessel 261 are blown off. Therefore, the expelling of the organic EL molecules is extremely fast in the film forming section 26 at the time of stopping the film formation.

Figure 4:
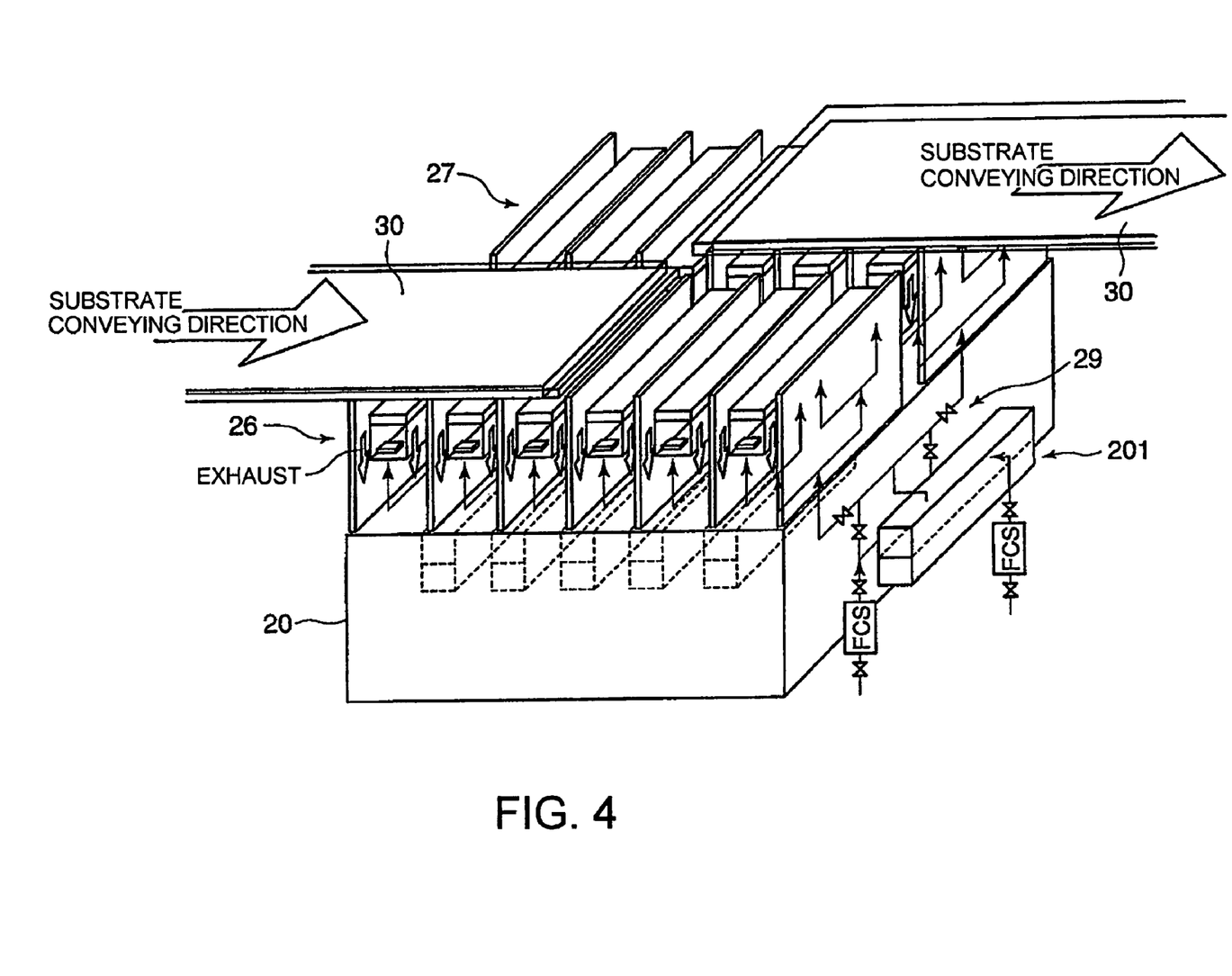
FIG. 4 is a perspective view showing a main portion of a film forming system according to a third embodiment of this invention.

FIG. 4 is a perspective view of a main portion of a film forming system according to another embodiment of this invention. In this embodiment, a film forming section comprises two film forming sections like in the first embodiment, wherein each of the film forming sections 26 and 27 has six ejection vessels. In FIG. 4, the same reference numerals are assigned to portions corresponding to those in the embodiment of FIGS. 1 and 3. The film forming section will be described in detail with reference to FIG. 5. As shown in FIG. 4, in a first film forming section array (chamber CHM1), six ejection vessels each extending to have a length equal to the width of a glass substrate are aligned adjacent to each other so that their length directions are parallel to each other. A glass substrate 30 moves at a predetermined speed over the group of ejection vessels in a direction crossing the above length direction. A second film forming section array (chamber CHM2) is configured in the same manner and another glass substrate 30 is supplied thereover at a timing different from that over the first array. The ejection vessels disposed in the two arrays form pairs and a carrier gas containing a raw material is supplied to each pair at different timings from the same raw material container section. When the carrier gas containing the raw material is selectively supplied to one of the pair of ejection vessels, the glass substrate is present thereover, while, during that time, the carrier gas containing the raw material is not supplied to the other of the pair of ejection vessels and the glass substrate is also not present thereover. Supply/movement of the glass substrates and selection as to which of the pair of ejection vessels the carrier gas containing the raw material is supplied to are cooperatively performed to determine the timing so that the carrier gas containing the raw material is always supplied to either of the pair and the substrate is present thereover.

Figure 5:
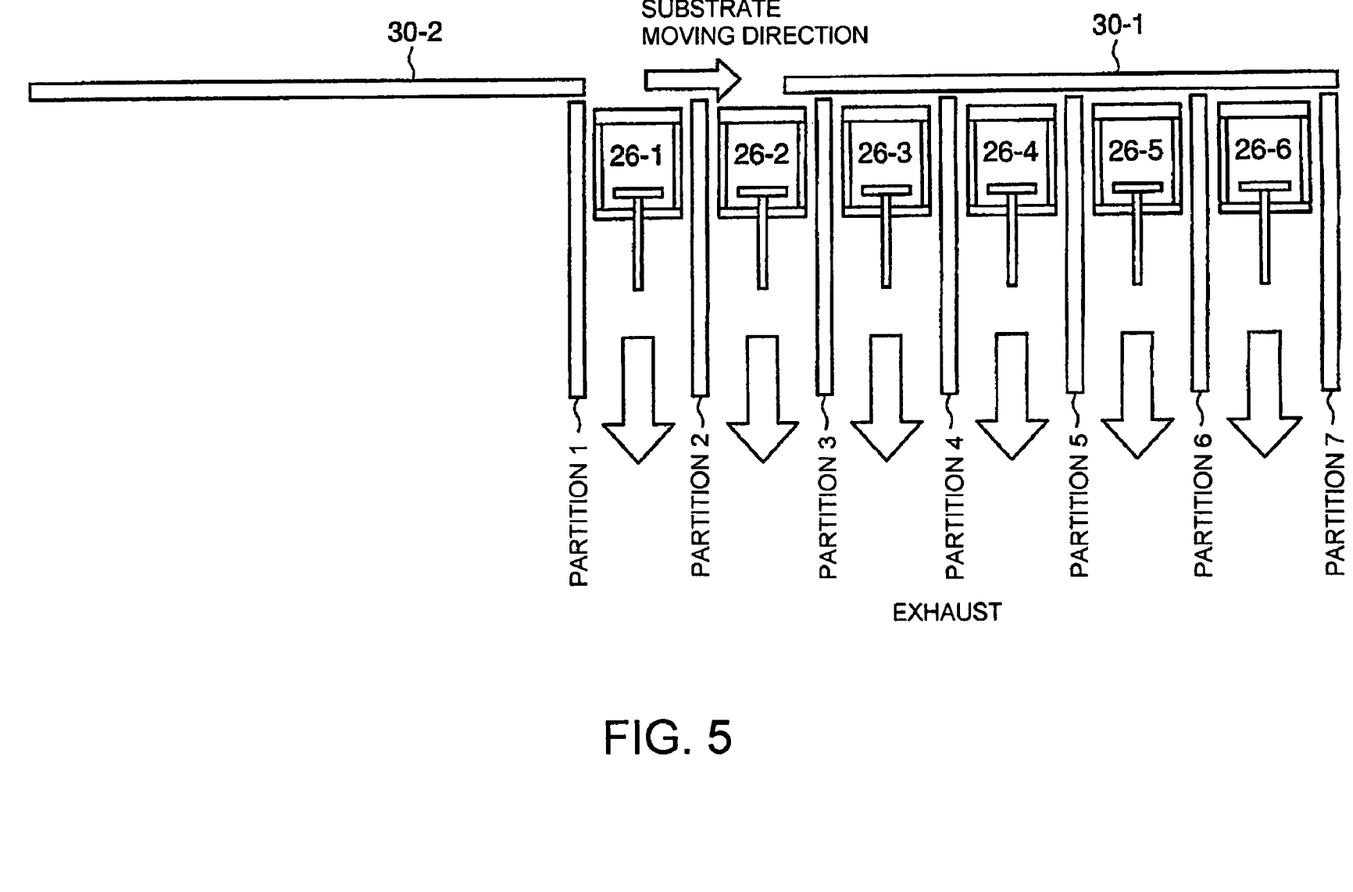
FIG. 5 is a diagram showing a film forming section of the film forming system according to the third embodiment of this invention.

Referring to FIG. 5, the single film forming section array (chamber) of the film forming system according to the embodiment of FIG. 4 will be described. FIG. 5 shows the single film forming section array for use in manufacturing an organic EL device by forming organic EL films in sequence on a substrate 30 of glass or the like, wherein the films of six layers are formed in sequence on the substrate. In this case, use can be made of a substrate with a size from 730×920 (mm) to 3000×5000 (mm).

The illustrated film forming section array comprises six ejection vessels 26-1 to 26-6 separated by partitions 1 to 7, wherein the ejection vessels eject carrier gases containing organic EL materials onto the glass substrate located above in the order of stacking of the films. These six ejection vessels 26-1 to 26-6 are aligned so that the extending directions of internal filters or shower plates are parallel to each other. Glass substrates 30-1 and 30-2 move, with a fixed interval therebetween, over the six ejection vessels from left to right in the figure and are subjected to formation of organic EL films by the organic EL raw materials ejected upward in the figure from respective ejecting portions of the ejection vessels 26-1 to 26-6. In this event, predetermined distances are maintained between the substrate 30-1, 30-2 and each partition and between the substrate 30-1, 30-2 and each of the ejection vessels 26-1 to 26-6, wherein the distance between the substrate 30-1, 30-2 and each partition is smaller than the distance between the substrate 30-1, 30-2 and each of the ejection vessels 26-1 to 26-6. The gases ejected upward from the respective ejection vessels pass through spaces between the side walls of the ejection vessels and the inner surfaces of the partitions so as to be exhausted downward as shown by arrows. The piping system as shown in FIGS. 3 and 4 is connected to each of the ejection vessels. Therefore, the film forming section array (chamber) shown in FIG. 5 is connected to the non-illustrated other film forming section array (chamber) through the respective piping systems. By controlling the respective piping systems of the plurality of film forming section arrays by respective switchers, it is possible to parallelly process glass substrates in two rows.

In the embodiment of FIG. 5, the glass substrate 30-1, 30-2 has a size of 2,160 mm×2,540 mm and moves in its longitudinal direction. The width of an ejection port of each ejection vessel in the glass substrate moving direction is 50 mm, the length of the ejection port perpendicular thereto is 2,170 mm, the width (thickness) of the side wall of each ejection vessel is 15 mm, the distance between the outer surface of the side wall of each ejection vessel and the inner surface of each of the partitions on both sides thereof is 30 mm, thus the distance between the inner surfaces of the adjacent partitions is 140 mm, the thickness of each partition is 15 mm, and the length of the film forming section array (chamber) in the substrate moving direction is 945 mm. The distance between the upper surface of each ejection vessel and the substrate is 20 mm, the distance between each partition and the substrate is 2 mm, and the temperature of each partition and each ejection vessel is set to 350 to 450° C. The pressure of a film forming atmosphere is 30 mTorr and the ejection speed of the carrier gas containing the raw material ejected from the ejecting portion is 3 m/sec, so that the carrier gas containing the raw material reaches the substrate in 0.1 seconds. The ejection flow rate of the carrier gas containing the raw material from each ejection vessel is 317 cc/min in terms of room temperature and the atmospheric pressure. Assuming that the substrate feed speed is 1.0 cm/sec, the time required for the substrate to pass through one ejection vessel is 264 seconds and the time required for the substrate to pass through six ejection vessels is 341.5 seconds. The use efficiency of the organic EL raw materials reaches 90%.

Figure 6:
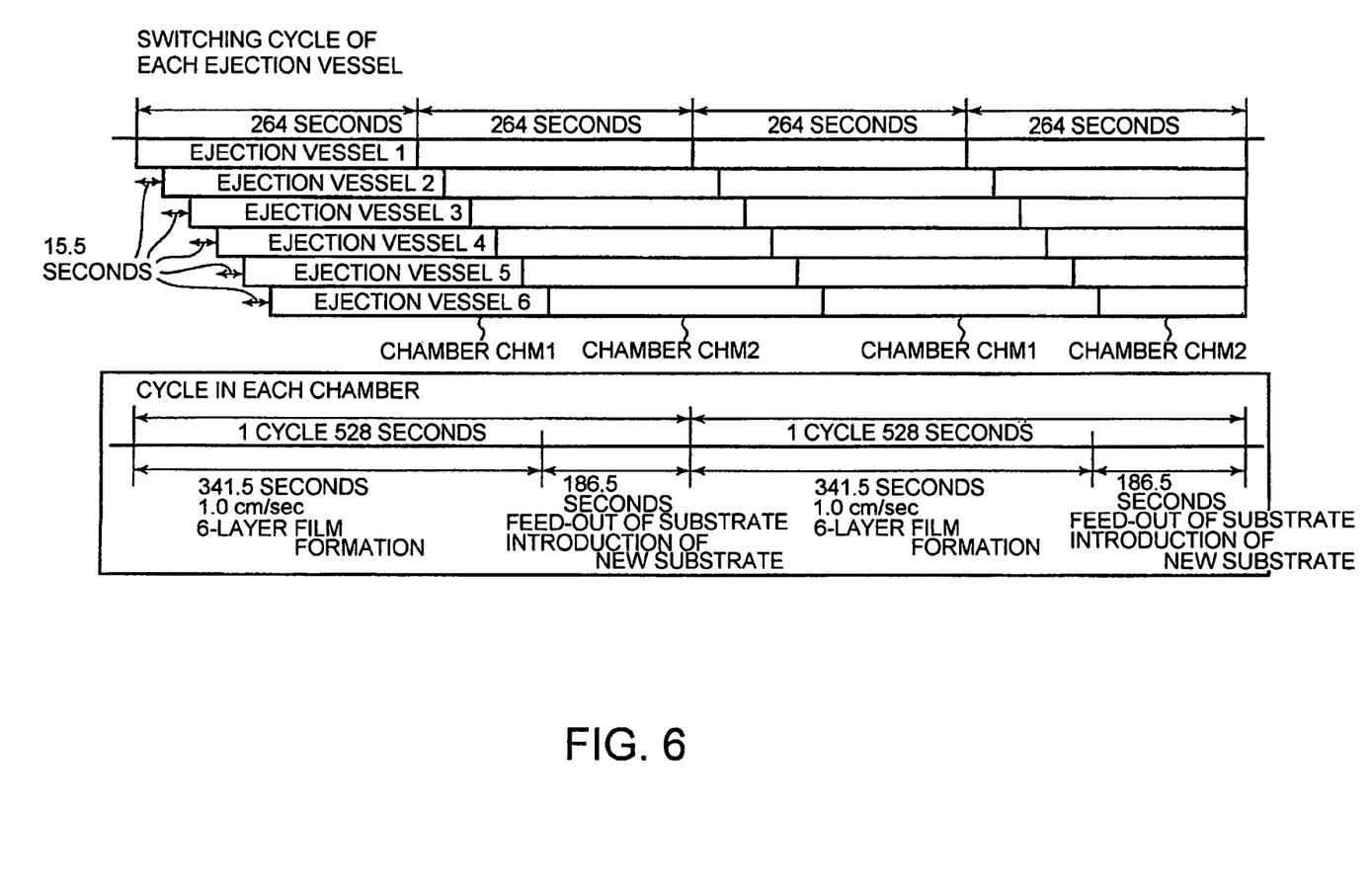
FIG. 6 is a timing chart showing switching timings and so on in the film forming system according to the third embodiment of this invention.

Referring here to FIG. 6, an upper chart is a timing chart showing a switching cycle between the ejection vessels in pairs arranged separately in the two film forming section arrays (chambers), wherein each ejection vessel is subjected to switching of gas supply per 264 seconds. A lower timing chart shows a cycle of the operation in each chamber, wherein, in each chamber, film formation of six layers is achieved in 341.5 seconds and, for 186.5 seconds thereafter, feed-out of a substrate finished with the film formation from the chamber and introduction of a new substrate into the chamber are carried out, so that one cycle is finished in 528 seconds in total. In this one cycle of 528 seconds (8 minutes and 48 seconds), the film formation of 6 layers on the two substrates is completed. The respective ejection vessels in the chamber CHM1, CHM2 are opened with a time lag of 15.5 seconds from each other.

Referring back to FIGS. 3 to 5, all the ejection vessels are made to have completely the same structure, the same piping system described with reference to FIG. 3 is connected to each of them, and the flow rates of the carrier gas to be supplied thereto are also set to the same value. In this case, the temperature of each ejection vessel may be set so as to match the properties of the organic EL molecules. The film forming rate/thickness is preferably controlled by the temperature of each raw material container section. Further, each ejection vessel is preferably made of a stainless steel and the ejecting portion of each ejection vessel is in the form of a stainless filter and is welded to the body. All the inner surfaces of each ejection vessel are preferably coated with a passive film of $Al_2O_3$ or the like having a low catalytic effect.

Further, in the film forming apparatus according to this invention having the plurality of film forming sections and carrying out the control as described with reference to FIG. 3, the carrier gas flows into the respective film forming sections at completely the same flow rate in either of the modes during the film formation and at the time of stopping the film formation and, therefore, the pressure in the respective ejection vessels forming the respective film forming sections can be maintained constant. This means that cross contamination between the ejection vessels can be prevented.

In the case where the ejection vessels for six layers all have the same size and the flow rates of a carrier gas to be ejected are set to the same value, the concentrations of organic EL raw material molecules in the carrier gas may be set to the same value when the required thicknesses of the respective layers are the same (red light emitting layer, green light emitting layer, blue light emitting layer, electron blocking layer: thickness is 20 to 10 nm for each), while, with respect to the layers with a larger thickness (electron transport layer, hole transport layer: thickness is 50 nm for each), it is necessary to increase the concentration of organic raw material molecules contained in the carrier gas in proportion to the thickness. If this is difficult, it is necessary to take a measure for the layer with the larger thickness to use a plurality of ejection vessels, to increase the opening width of the ejection vessel, to increase the flow rate of the carrier gas, or the like.

Further, as described before, by providing the plurality of film forming sections and temporally switching the modes of these plurality of film forming sections, it is possible to quickly form a plurality of films necessary for an organic EL device and thus to largely improve the throughput and also improve the use efficiency of the organic EL raw materials. For example, in the case of manufacturing an organic EL device by forming organic EL material films of six layers by switching three film forming sections, organic EL devices can be manufactured at intervals of about 6 minutes and, in this case, the use efficiency of the organic EL raw materials can be improved to 82%. As shown in FIGS. 4 to 6, in the case of performing the film formation using the two film forming section arrays, the 6-layer film formation is enabled at intervals of about 8 minutes and the material use efficiency reaches 90%.

Herein, in order to manufacture an organic EL device having the intended characteristics, it is extremely important to keep constant the concentration, in a carrier gas, of an organic EL raw material evaporated from each raw material container section. In other words, if the concentration of the organic EL raw material in the carrier gas changes in a short time, it is impossible to uniformly deposit the organic EL material on a glass substrate or the like on a molecular basis over a long period of time.

When the concentration of an organic EL raw material in a carrier gas is constant, the required concentration is determined as follows. At first, assuming that the molecular weight of organic EL materials of six layers is 500, a molecular layer of each material film has a thickness of 0.7 nm and the number of molecules is $2.0 \times 10E14$ ($10^{14}$) per $cm^2$. Assuming that the thickness of each of a red light emitting layer, a green light emitting layer, a blue light emitting layer, and an electron blocking layer is 20 nm, the number of molecules of the material required for each layer is about $6 \times 10E15$ ($10^{15}$) per $cm^2$. Since the thickness of each of an electron transport layer and a hole transport layer is 50 nm, $1.4 \times 10E16$ ($10^{16}$) molecules are required per cm² for each layer. Assuming that the density of a carrier gas flow sprayed onto a glass substrate is 2.58×10E−3 ($10^{-3}$) cc/sec per cm², the number density of a gas sprayed onto the surface of the glass substrate is 6.96×10E16 ($10^{16}$) molecules/sec per cm². In the foregoing example, since the glass substrate passes over the ejection port with the width of 5 cm at the speed of 1.0 cm/sec, the gas is sprayed onto the respective portions of the substrate for 5 seconds and the number of gas molecules in the carrier gas containing the organic EL molecules for 5 seconds becomes 3.48×10E17 ($10^{17}$) per cm². Since about 6×10E15 ($10^{15}$) organic EL molecules per cm² should be contained in this gas flow in the case of each of the red light emitting layer, the green light emitting layer, the blue light emitting layer, and the electron blocking layer and 1.4×10E16 ($10^{16}$) organic EL molecules per cm² should be contained in this gas flow in the case of each of the electron transport layer and the hole transport layer, it is necessary to set the concentration of the organic EL raw material molecules contained in the carrier gas to about 1.7% for each of the red light emitting layer, the green light emitting layer, the blue light emitting layer, and the electron blocking layer and to about 4% for each of the electron transport layer and the hole transport layer. These concentrations are fully achievable by heating the respective materials at temperatures of 500° C. or less. This concentration required for each layer can be set to a different value by changing the speed, flow rate, and density of the carrier gas flow sprayed onto the glass substrate, the moving speed of the glass substrate, the opening width of the ejecting portion, and so on. Further, the concentration of the organic EL raw material molecules in the carrier gas can be controlled by the heating temperature used for evaporating the material, the pressure at the evaporating portion, and so on.

As a result of this, according to the present film forming system, it is possible to control the film formation with a predetermined thickness quite accurately and at high speed.

INDUSTRIAL APPLICABILITY

According to this invention, it is possible to obtain a high-quality organic EL device by applying it to organic EL film formation. Further, this invention is applicable not only to the organic EL film formation, but also to film formation for various display devices and so on requiring high quality and long lifetime.

The invention claimed is:

1. A film forming apparatus that evaporates a raw material by an evaporation unit, transports said evaporated raw material using a carrier gas, and ejects, at a time of a film formation, said carrier gas containing said evaporated raw material onto a substrate from a gas ejection unit, thereby depositing a film of a predetermined material,
   wherein said film forming apparatus comprises a switching section having a first, a second, a third piping system, wherein
   the first piping system establishes connection between the evaporation unit and the gas ejection unit,
   the second piping system establishes connection between the gas ejection unit and a carrier gas source, wherein said second piping system is connected to the gas ejection unit separately from the first piping system, and
   the third piping system establishes connection between a carrier gas source and the first piping system downstream of the evaporation unit, wherein the three piping systems comprise valves, which are controlled
   for stopping, at a time of stopping said film formation subsequent to said time of said film formation, supply of the carrier as containing said evaporated raw material to said as ejection unit, and
   for supplying, instead of said carrier gas containing said evaporated raw material, said carrier gas not containing said evaporated raw material to said gas ejection unit, and
   wherein said film forming apparatus further comprises a plurality of said gas ejection units that are provided for said evaporation unit.

2. A film forming apparatus according to claim 1, further comprising:
   gas flow paths provided from said evaporation unit to said plurality of gas ejection units, respectively; and
   a switching unit for supplying the carrier gas containing said evaporated raw material to said gas ejection unit selected from said plurality of gas ejection units.

3. A film forming apparatus according to claim 2, further comprising a carrier gas supply unit for supplying a gas of the same kind as said carrier gas to said gas ejection unit not through said evaporation unit.

4. A film forming apparatus according to claim 1, wherein each of said plurality of gas ejection units comprises:
   an ejection vessel;
   a gas dispersion plate provided in said ejection vessel for dispersing the carrier gas containing said evaporated raw material; and a filter or shower plate provided between said gas dispersion plate and said substrate,
   wherein said ejection vessel is provided with a supply port, and said carrier gas not containing said evaporated raw material is supplied into said ejection vessel through said supply port.

5. A film forming apparatus according to claim 4, wherein said ejection vessel has a plurality of said supply ports, the apparatus further comprising:
   a gas pressure adjusting portion provided between said evaporation unit and said ejection vessel;
   wherein lengths of piping between said gas pressure adjusting portion and said plurality of supply ports of said ejection vessel are substantially equal to each other.

6. A film forming apparatus according to claim 5, further comprising a plurality of said gas dispersion plates, said plurality of gas dispersion plates and said plurality of supply ports being arranged in one row in the same direction, and said filter or shower plate having a shape extending in said direction.

7. A film forming apparatus according to claim 5, wherein the piping between said supply ports and said gas pressure adjusting portion is branched into $2^n$ (n is a natural number) paths.

8. A film forming apparatus according to claim 4, further comprising different substrates that are respectively supplied to said plurality of gas ejection units at different timings.

9. A film forming apparatus according to claim 4, wherein an opening width of said gas ejection unit, a moving speed of said substrate, a flow speed of said carrier gas not containing said evaporated raw material, and a supply amount of said carrier gas not containing said evaporated raw material are determined so as to obtain a predetermined film thickness.

10. A film forming apparatus according to claim 4, wherein said evaporation unit comprises;
    a raw material container section filled with said raw material;
    piping for introducing said carrier gas into said raw material container section;
    and a heater for heating said raw material.

11. A film forming system comprising a plurality of the film forming apparatuses each according to claim 10, wherein said film forming system is characterized in that said film forming system is for stacking a plurality of films of predetermined materials on said substrate, said plurality of film forming apparatuses correspond to said different materials, respectively, and said gas ejection units corresponding to the respective predetermined materials, one for each material, are aligned along a moving direction of said substrate in the order of stacking of the films.

12. A film forming system according to claim 11, wherein said gas ejection units are aligned so that the extending directions of said filters or shower plates are parallel to each other, a partition is provided between said aligned gas ejection units, said substrate moves at a predetermined distance maintained from said partition, the distance between said substrate and said partition is smaller than that between said substrate and said gas ejection unit, and a space is provided between said gas ejection unit and said partition.

13. A film forming system according to claim 11, wherein a gas of the same kind as said carrier gas not containing said evaporated raw material is supplied through said gas supply unit to the gas ejection unit not supplied with the carrier gas containing said evaporated raw material.

14. A film forming system according to claim 13, wherein a flow rate of the gas of the same kind as said carrier gas not containing said evaporated raw material is substantially equal to that of the carrier gas containing said evaporated raw material.

15. A film forming system according to claim 11, wherein said predetermined materials are materials for forming an organic electroluminescence element.

16. A film forming method that evaporates a raw material by an evaporation unit, transports said evaporated raw material using a carrier gas, and ejects, at a time of a film formation, said carrier gas containing said evaporated raw material onto a substrate from a gas ejection unit, thereby forming a film of a predetermined material,
wherein a plurality of said gas ejection units are connected to said evaporation unit and said carrier gas containing said evaporated raw material is supplied to said gas ejection unit selected from said plurality of gas ejection units, said film forming method comprising:
using a switching section having a first, a second, a third piping system, wherein
the first piping system establishes connection between the evaporation unit and the gas ejection unit,
the second piping system establishes connection between the gas ejection unit and a carrier gas source, wherein said second piping system is connected to the gas ejection unit separately from the first piping system, and
the third piping system piping system establishes connedtion between a carrier gas source and the first piping system downstream of the evaporation unit, wherein the three sipping systems comprise valves, which are controlled to stop, at a time of stopping said film formation subsequent to said time of said film formation, supply of said carrier gas containing said evaporated raw material to said gas ejection unit, and to supply, instead of said carrier gas containing said evaporated raw material said carrier gas not containing said evaporated raw material to said gas ejection unit.

17. A film forming method according to claim 16, wherein each of said plurality of gas ejection units comprises an ejection vessel, said ejection vessel is provided with a plurality of supply ports and gas dispersion plates corresponding to said plurality of supply ports, respectively, and said carrier gas not containing said evaporated raw material ejected into said ejection vessel through said supply ports is dispersed by said gas dispersion plates and then ejected onto said substrate through a filter or shower plate.

18. A film forming method according to claim 17, wherein a gas of the same kind as said carrier gas not containing said evaporated raw material is supplied to said gas ejection unit not through said evaporation unit, and the carrier gas containing said evaporated raw material and the gas of the same kind as said carrier gas not containing said evaporated raw material are supplied to said gas ejection units separately from each other.

19. A film forming method according to claim 18, wherein a flow rate of the gas of the same kind as said carrier gas not containing said evaporated raw material is substantially equal to that of the carrier gas containing said evaporated raw material.

20. A film forming method according to claim 17, wherein different substrates arc supplied to said plurality of gas ejection unit at different timings, respectively.

21. A film forming method according to claim 17, further comprising:
determining a moving speed of said substrate and a flow speed and a supply amount of the carrier gas containing said evaporated raw material so as to obtain a predetermined film thickness.

22. A manufacturing method of a laminate in which a plurality of films of predetermined materials are stacked on a substrate, said manufacturing method comprising:
providing one evaporation unit and a plurality of gas ejection units for each of the predetermined materials of the films selected from said plurality of films; and
aligning said gas ejection units corresponding to said respective materials, one for each material, in the order of stacking of the films, thereby forming said selected films in the order of stacking of the films, respectively, using the method according to claim 17.

23. A manufacturing method according to claim 22, further comprising:
moving the substrate over said aligned gas ejection units; and
continuously supplying the carrier gases containing said evaporated raw materials in the order of stacking of the films along a moving direction of said substrate.

24. A manufacturing method according to claim 23, further comprising:
arranging said plurality of gas supply ports and said plurality of gas dispersion plates in one row in the same direction;
forming said filter or shower plate to have a shape extending in said direction;
arranging said plurality of ejection vessels through partitions therebetween so that the extending directions of said filters or shower plates are parallel to each other, and;
while moving said substrate at a predetermined distance from said partitions and in a direction crossing said direction, ejecting in sequence the carrier gases containing the different evaporated raw materials to said substrate from said plurality of ejection vessels, respectively, at a distance greater than said predetermined distance, and exhausting the ejected carrier gases containing said evaporated raw materials through spaces between said ejection vessels and said partitions.

25. An electronic device manufacturing method characterized by comprising a step of performing film formation by the film forming method according to claim 16.

26. An organic electroluminescence element manufacturing method that forms an organic electric field light emitting layer by the film forming method according to claim 16.

27. A manufacturing method according to claim 22, wherein said laminate is an organic electroluminescence element.

* * * * *